(12) United States Patent
Ikeda et al.

(10) Patent No.: US 11,437,428 B2
(45) Date of Patent: Sep. 6, 2022

(54) DISPLAY DEVICE

(71) Applicant: Japan Display Inc., Tokyo (JP)

(72) Inventors: Masanobu Ikeda, Tokyo (JP); Yoshinori Aoki, Tokyo (JP); Akihiro Ogawa, Tokyo (JP); Yasuhiro Kanaya, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/990,457

(22) Filed: Aug. 11, 2020

(65) Prior Publication Data
US 2021/0057483 A1 Feb. 25, 2021

(30) Foreign Application Priority Data

Aug. 19, 2019 (JP) .............................. JP2019-149927

(51) Int. Cl.
*H01L 27/15* (2006.01)
*H01L 33/48* (2010.01)
*H01L 33/62* (2010.01)

(52) U.S. Cl.
CPC .......... *H01L 27/156* (2013.01); *H01L 33/486* (2013.01); *H01L 33/62* (2013.01)

(58) Field of Classification Search
CPC ...... H01L 27/156; H01L 33/486; H01L 33/62
See application file for complete search history.

(56) References Cited

U.S. PATENT DOCUMENTS

| 2017/0213502 | A1 | 7/2017 | Henry et al. |
| 2019/0305036 | A1* | 10/2019 | Ahn ........................ H01L 33/62 |
| 2020/0126477 | A1 | 4/2020 | Henry et al. |

FOREIGN PATENT DOCUMENTS

| CN | 2814577 Y | 9/2006 |
| CN | 110323245 A | 10/2019 |
| JP | 2017-529557 A | 10/2017 |

OTHER PUBLICATIONS

Office Action issued in Taiwanese Application No. 109127321 dated Oct. 14, 2021, with English translation.
Chinese Office Action dated May 20, 2022, for Chinese Patent Application No. 202010825927.4, with machine English translation.

* cited by examiner

*Primary Examiner* — Sue A Purvis
*Assistant Examiner* — Scott Stowe
(74) *Attorney, Agent, or Firm* — Michael Best & Friedrich LLP

(57) ABSTRACT

A display device comprises: a substrate; a plurality of pixels provided to the substrate; and a plurality of light emitting elements provided to the respective pixels. The light emitting elements include a plurality of first light emitting elements, a plurality of second light emitting elements, and a plurality of third light emitting elements, the first light emitting elements are arrayed on the substrate in a first direction and a second direction, the third light emitting element has a part not overlapping the first light emitting element or the second light emitting element when one of the pixels is viewed in the first direction, and the third light emitting element has a part not overlapping the first light emitting element or the second light emitting element when one of the pixels is viewed in the second direction.

13 Claims, 12 Drawing Sheets

DISPLAY DEVICE

CROSS-REFERENCE TO RELATED APPLICATIONS

This application claims priority from Japanese Application No. 2019-149927, filed on Aug. 19, 2019, the contents of which are incorporated by reference herein in its entirety.

BACKGROUND

1. Technical Field

The present disclosure relates to a display device.

2. Description of the Related Art

Displays with micro light emitting diodes (micro LEDs) serving as display elements have recently been attracting attention (refer to Japanese Translation of PCT International Application Publication No. 2017-529557 (JP-T-2017-529557), for example). A plurality of LEDs are mounted on a flat surface of an array substrate (or a driver backplane in JP-T-2017-529557). The LEDs are arrayed and output light in different colors (e.g., RGB).

In displays with micro LEDs, LEDs having some colors may possibly overlap LEDs having the other colors depending on the array structure of the LEDs and the observation direction of an observer. As a result, the display property may possibly deteriorate.

SUMMARY

It is an object of the present disclosure to at least partially solve the problems in the conventional technology.

A display device according to one embodiment of the present disclosure includes a substrate, a plurality of pixels provided to the substrate, and a plurality of light emitting elements provided to the respective pixels. The light emitting elements include a plurality of first light emitting elements configured to output red light, a plurality of second light emitting elements configured to output green light, and a plurality of third light emitting elements configured to output blue light, the first light emitting elements are arrayed on the substrate in a first direction and a second direction intersecting the first direction, the third light emitting element has a part not overlapping the first light emitting element or the second light emitting element when one of the pixels is viewed in the first direction, and the third light emitting element has a part not overlapping the first light emitting element or the second light emitting element when one of the pixels is viewed in the second direction.

DETAILED DESCRIPTION

Figure 1:
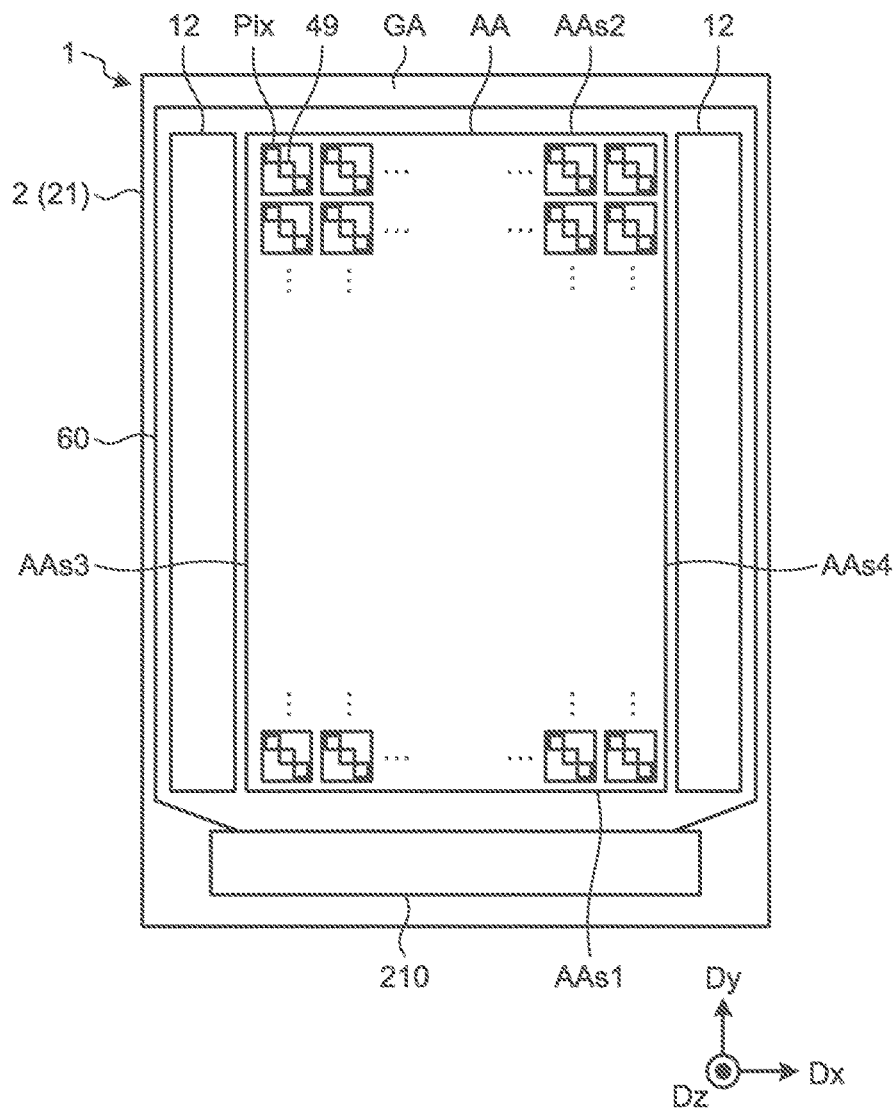
FIG. 1 is a plan view schematically illustrating a display device according to a first embodiment.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by like reference numerals, and detailed explanation thereof may be appropriately omitted.

In the present specification and the accompanying claims, to express an aspect where a first structure is disposed on a second structure, the term "on" includes both of the following cases if not specially defined: the case where the first structure is disposed directly on the second structure in contact with the second structure and the case where the first structure is disposed on the second structure with another structure interposed therebetween.

First Embodiment

FIG. 1 is a plan view schematically illustrating a display device according to a first embodiment. As illustrated in FIG. 1, a display device 1 includes an array substrate 2, a plurality of pixels Pix, drive circuits 12, a drive integrated circuit (IC) 210, and cathode wiring 60. The array substrate 2 is a drive circuit board for driving the pixels Pix and is also called a backplane or an active matrix substrate. The array substrate 2 includes a substrate 21, a plurality of transistors, a plurality of capacitances, and various kinds of wiring, for example. A flexible printed circuits (FPC), which is not particularly illustrated, may be coupled on the array substrate 2. The FPCs receive control signals and electric power for driving the drive circuits 12 and the drive IC 210.

As illustrated in FIG. 1, the display device 1 has a display region AA and a peripheral region GA. The display region AA is disposed overlapping the pixels Pix and displays an image. The peripheral region GA does not overlap the pixels Pix and is disposed outside the display region AA.

The pixels Pix are arrayed in a first direction Dx and a second direction Dy in the display region AA of the substrate 21. The first direction Dx and the second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 21, for example. In the following description, planar view indicates the positional relation when viewed in the third direction Dz.

The display region AA has a first side AAs1, a second side AAs2, a third side AAs3, and a fourth side AAs4. The first side AAs1 and the second side AAs2 extend parallel to each other. The third side AAs3 and the fourth side AAs4 extend parallel to each other and are provided between the first side AAs1 and the second side AAs2. In the present specification, the first direction Dx extends along the first side AAs1 and the second side AAs2 of the display region AA. The second direction Dy extends along the third side AAs3 and the fourth side AAs4 of the display region AA.

The drive circuits 12 drive a plurality of gate lines based on various control signals received from the drive IC 210 or the outside. The drive circuits 12 sequentially or simultaneously select a plurality of gate lines and supply gate drive signals to the selected gate lines. As a result, the drive circuits 12 select a plurality of pixels Pix coupled to the gate lines.

The drive IC 210 is a circuit that controls display on the display device 1. The drive IC 210 is mounted on the peripheral region GA of the substrate 21 as chip on glass (COG). The mounting form of the drive IC 210 is not limited thereto, and the drive IC 210 may be mounted on FPCs or a rigid substrate coupled to the peripheral region GA of the substrate 21 as chip on film (COF).

The cathode wiring 60 is provided in the peripheral region GA of the substrate 21. The cathode wiring 60 is provided surrounding the pixels Pix in the display region AA and the drive circuits 12 in the peripheral region GA. Cathodes of a plurality of light emitting elements 3 are electrically coupled to the common cathode wiring 60 and supplied with a fixed potential (e.g., a ground potential). More specifically, a cathode terminal 32 (refer to FIG. 3) of the light emitting element 3 is coupled to the cathode wiring 60 via a cathode electrode 22.

Figure 2:
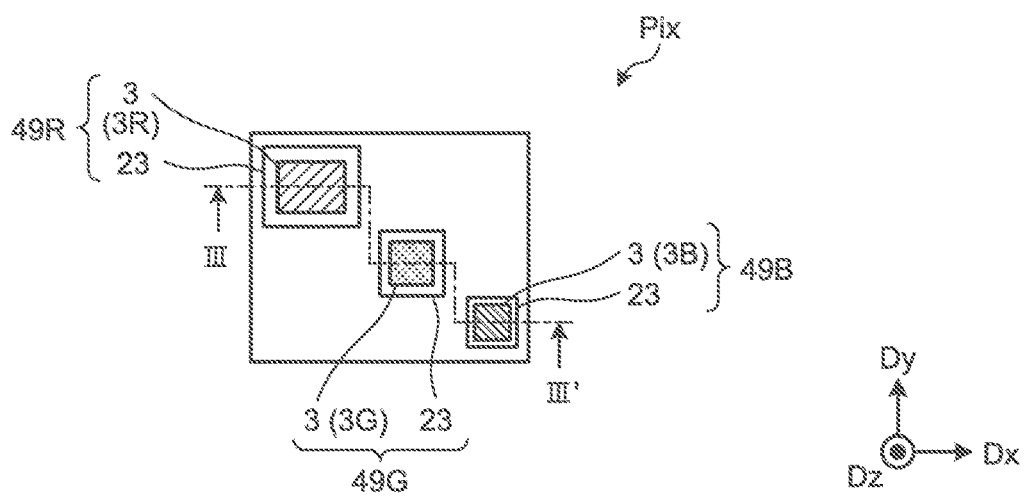
FIG. 2 is a plan view of a plurality of sub-pixels.

FIG. 2 is a plan view of a plurality of sub-pixels. As illustrated in FIG. 2, one pixel Pix includes a plurality of sub-pixels 49. The pixel Pix includes a first sub-pixel 49R, a second sub-pixel 49G, and a third sub-pixel 49B, for example. The first sub-pixel 49R displays a primary color of red as the first color. The second sub-pixel 49G displays a primary color of green as the second color. The third sub-pixel 49B displays a primary color of blue as the third color. As illustrated in FIG. 2, the first sub-pixel 49R, the second sub-pixel 49G, and the third sub-pixel 49B in one pixel Pix are disposed side by side in an oblique direction intersecting the first direction Dx and the second direction Dy. The first color, the second color, and the third color are not limited to red, green, and blue, respectively, and may be any desired colors, such as complementary colors. In the following description, the first sub-pixel 49R, the second sub-pixel 49G, and the third sub-pixel 49B are referred to as sub-pixels 49 when they need not be distinguished from one another.

The sub-pixels 49 each include the light emitting element 3 and an anode electrode 23. The light emitting elements 3 are provided to the respective sub-pixels 49. The display device 1 displays an image by outputting different light from a first light emitting element 3R, a second light emitting element 3G, and a third light emitting element 3B in the first sub-pixel 49R, the second sub-pixel 49G, and the third sub-pixel 49B, respectively. The first light emitting element 3R outputs red light. The second light emitting element 3G outputs green light. The third light emitting element 3B outputs blue light. In the following description, the first light emitting element 3R, the second light emitting element 3G, and the third light emitting element 3B are referred to as light emitting elements 3 when they need not be distinguished from one another. The light emitting elements 3 may output different light in four or more colors.

The light emitting element 3 is a light emitting diode (LED) chip having a size of approximately 3 μm to 300 μm in planar view. An LED chip having a size smaller than 100 μm is called a micro LED, which is not strictly defined. The display device 1 including the micro LEDs in the respective pixels is also called a micro LED display device. The term "micro" of the micro LED is not intended to limit the size of the light emitting element 3.

Figure 3:
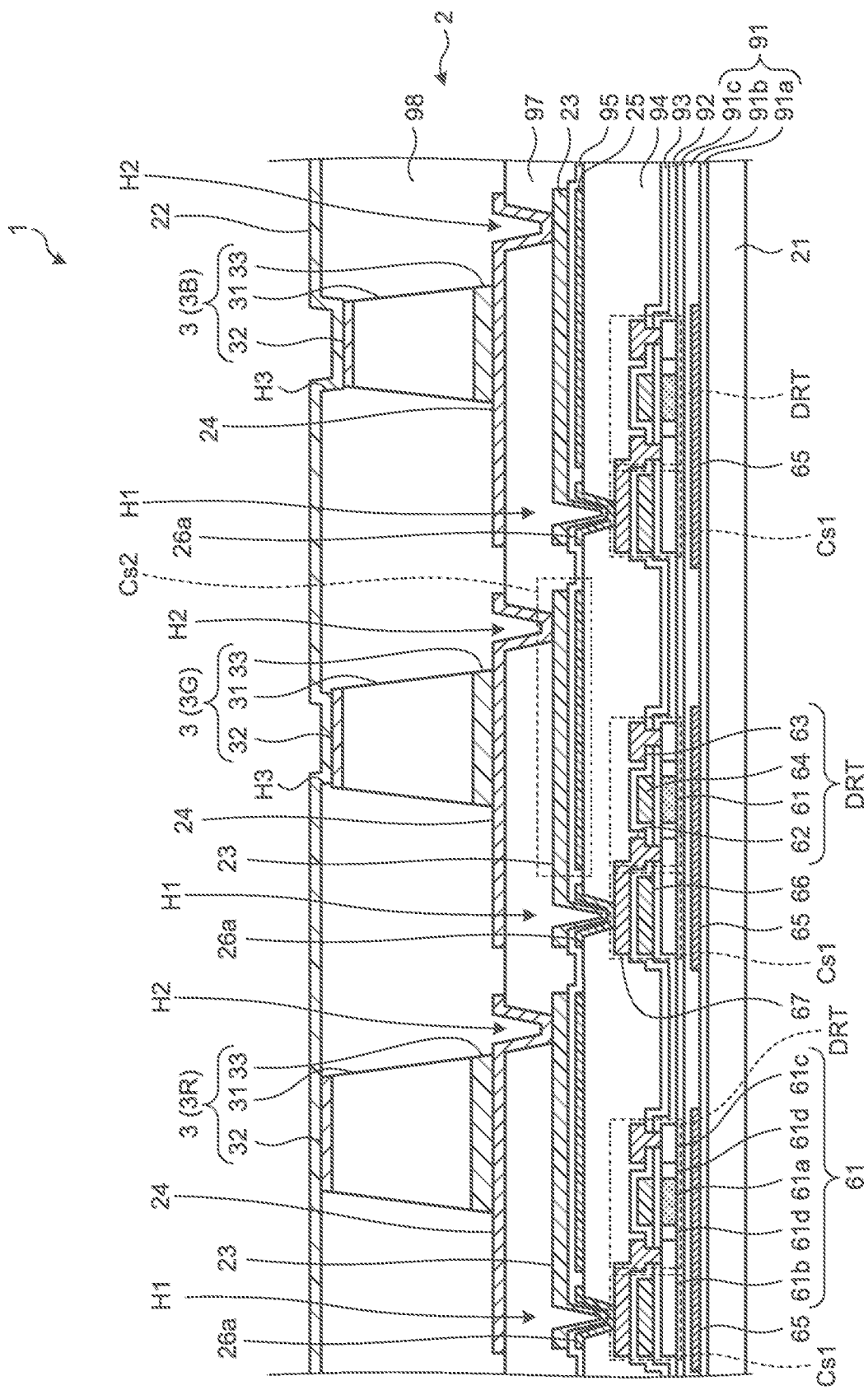
FIG. 3 is a sectional view along line III-III' of FIG. 2.

The following describes a sectional configuration of the display device 1. FIG. 3 is a sectional view along line III-III' of FIG. 2. As illustrated in FIG. 3, the light emitting elements 3 are provided on the array substrate 2. The array substrate 2 includes the substrate 21, the anode electrodes 23, mounting electrodes 24, counter electrodes 25, coupling electrodes 26a, various transistors, various kinds of wiring, and various insulating films.

The substrate 21 is an insulating substrate and is a glass substrate made of quartz or non-alkali glass or a resin substrate made of polyimide, for example. If the substrate 21 is a flexible resin substrate, the display device 1 may be provided as a sheet display. The substrate 21 is not necessarily made of polyimide and may be made of other resin materials.

In the present specification, the direction from the substrate 21 toward the light emitting element 3 in the direction perpendicular to the surface of the substrate 21 is referred to as "upper side" or simply as "on". The direction from the light emitting element 3 toward the substrate 21 is referred to as "lower side" or simply as "under".

An undercoat film 91 is provided on the substrate 21. The undercoat film 91 has a three-layered structure including insulating films 91a, 91b, and 91c, for example. The insulating film 91a is a silicon oxide film, the insulating film 91b is a silicon nitride film, and the insulating film 91c is a silicon oxide film. The lower insulating film 91a is provided to improve adhesion between the substrate 21 and the undercoat film 91. The middle insulating film 91b is provided as a block film that prevents water and impurities from entering from outside. The upper insulating film 91c is provided as a block film that prevents hydrogen atoms contained in the silicon nitride film of the insulating film 91b from diffusing toward a semiconductor layer 61.

The structure of the undercoat film 91 is not limited to that illustrated in FIG. 3. The undercoat film 91 may be a single-layered film or a two-layered film, for example, or may be a multilayered film having four or more layers. If the substrate 21 is a glass substrate, the silicon nitride film may be formed directly on the substrate 21 because silicon nitride films have relatively high adhesion.

A light shielding film 65 is provided on the insulating film 91a. The light shielding film 65 is provided between the semiconductor layer 61 and the substrate 21. The light shielding film 65 can prevent light from entering into a channel region 61a of the semiconductor layer 61 from the substrate 21. Alternatively, the light shielding film 65 may be made of conductive material and supplied with a predetermined electric potential. As a result, the light shielding film 65 may have a back-gate effect on a drive transistor DRT. The light shielding film 65 may be provided on the substrate 21, and the insulating film 91a may be provided covering the light shielding film 65.

The drive transistor DRT is provided on the undercoat film 91. While one drive transistor DRT is provided corresponding to one light emitting element 3 in FIG. 3, a plurality of transistors constituting a pixel circuit may be provided corresponding to one light emitting element 3.

The drive transistor DRT includes the semiconductor layer 61, a source electrode 62, a drain electrode 63, and a gate electrode 64. The semiconductor layer 61 is provided on the undercoat film 91. The semiconductor layer 61 is made of polysilicon, for example. The material of the semiconductor layer 61 is not limited thereto, and the semiconductor layer 61 may be made of a microcrystalline oxide semiconductor, an amorphous oxide semiconductor, or low-temperature polysilicon, for example. While only an n-type TFT is provided as the drive transistor DRT, a p-type TFT may be simultaneously formed. In the n-type TFT, the semiconductor layer 61 includes a channel region 61a, a source region 61b, a drain region 61c, and a low-concentration impurity region 61d. The low-concentration impurity region 61d is provided between the channel region 61a and the source region 61b and between the channel region 61a and the drain region 61c.

A gate insulating film 92 is provided on the undercoat film 91 to cover the semiconductor layer 61. The gate insulating film 92 is a silicon oxide film, for example. The gate electrode 64 is provided on the gate insulating film 92. First wiring 66 is provided in the same layer as the gate electrode 64. The gate electrode 64 and the first wiring 66 are made of molybdenum tungsten (MoW), for example. While the drive transistor DRT in the example illustrated in FIG. 3 has a top-gate structure in which the gate electrode 64 is provided on the semiconductor layer 61, the structure of the drive transistor DRT is not limited thereto. The drive transistor DRT may have a bottom-gate structure in which the gate electrode 64 is provided under the semiconductor layer 61 or a dual-gate structure in which the gate electrodes 64 are provided both on and under the semiconductor layer 61.

An interlayer insulating film 93 is provided on the gate insulating film 92 to cover the gate electrode 64. The interlayer insulating film 93 has a multilayered structure of a silicon nitride film and a silicon oxide film, for example. The source electrode 62 and the drain electrode 63 are provided on the interlayer insulating film 93. The source electrode 62 is coupled to the source region 61b through a contact hole formed in the gate insulating film 92 and the interlayer insulating film 93. The drain electrode 63 is coupled to the drain region 61c through a contact hole formed in the gate insulating film 92 and the interlayer insulating film 93. The source electrode 62 is coupled to second wiring 67 serving as routing wiring. The source electrode 62, the drain electrode 63, and the second wiring 67 may have a three-layered structure of titanium (Ti), aluminum (Al), and titanium (Ti), for example.

Part of the second wiring 67 is provided in a region overlapping the first wiring 66. The first wiring 66 and the second wiring 67 facing each other with the interlayer insulating film 93 interposed therebetween form capacitance Cs1. The first wiring 66 is provided in a region overlapping part of the semiconductor layer 61. The capacitance Cs1 includes capacitance formed by the semiconductor layer 61 and the first wiring 66 facing each other with the gate insulating film 92 interposed therebetween.

A first organic insulating film 94 is provided on the interlayer insulating film 93 to cover the drive transistor DRT and the second wiring 67. The first organic insulating film 94 is made of organic material, such as photosensitive acrylic. Organic material, such as photosensitive acrylic, is excellent in coverage property for difference in level of wiring and surface flatness compared with inorganic insulating material formed by CVD, for example.

The counter electrode 25, a capacitance insulating film 95, and the anode electrode 23 are layered in order on the first organic insulating film 94. The counter electrode 25 is made of translucent conductive material, such as indium tin oxide (ITO). The coupling electrode 26a is provided in the same layer as the counter electrode 25. The coupling electrode 26a is provided covering the inside of a contact hole H1 formed in the first organic insulating film 94 and is coupled to the second wiring 67 at the bottom of the contact hole H1.

The capacitance insulating film 95 is provided covering the counter electrode 25 and the coupling electrode 26a and has an opening in a region overlapping the contact hole H1. The capacitance insulating film 95 is a silicon nitride film, for example. The anode electrode 23 faces the counter electrode 25 with the capacitance insulating film 95 interposed therebetween. The anode electrode 23 is electrically coupled to the coupling electrode 26a and the second wiring 67 through the contact hole H1. As a result, the anode electrode 23 is electrically coupled to the drive transistor DRT. The anode electrode 23 has a multilayered structure of Ti and Al. The material of the anode electrode 23 is not limited thereto, and the anode electrode 23 may be made of material including at least one of metals of Mo and Ti. Alternatively, the anode electrode 23 may be made of alloy including at least one of Mo and Ti or translucent conductive material.

Capacitance Cs2 is formed between the anode electrode 23 and the counter electrode 25 facing each other with the capacitance insulating film 95 interposed therebetween. The counter electrode 25 made of ITO also serves as a barrier film that protects various kinds of wiring, such as the second wiring 67, in forming the anode electrode 23. In patterning the anode electrode 23, the counter electrode 25 is partially exposed to etching environment. By annealing performed between formation of the counter electrode 25 and formation of the anode electrode 23, the counter electrode 25 has sufficient resistance to etching for the anode electrode 23.

A second organic insulating film 97 is provided on the anode electrode 23. The second organic insulating film 97 has a contact hole H2 reaching the anode electrode 23. The second organic insulating film 97 is made of the same organic material as that of the first organic insulating film 94. The mounting electrode 24 is provided on the second organic insulating film 97 and electrically coupled to the anode electrode 23 through the contact hole H2. The mounting electrode 24 has a multilayered structure of Ti and Al like the anode electrode 23. The mounting electrode 24 may be made of conductive material different from that of the anode electrode 23. The second organic insulating film 97 may be made of conductive material different from that of the first organic insulating film 94.

The light emitting elements 3 (the first light emitting element 3R, the second light emitting element 3G, and the third light emitting element 3B) are mounted on the respective mounting electrodes 24. The light emitting elements 3 are each mounted such that an anode terminal 33 is in contact with the mounting electrode 24. Connection between the anode terminal 33 of the light emitting element 3 and the mounting electrode 24 is not particularly restricted as long as it can secure excellent continuity between the anode terminal 33 and the mounting electrode 24 and does not damage objects formed on the array substrate 2. Examples of the method for connecting the anode terminal 33 and the mounting electrode 24 include, but are not limited to, reflowing using low-temperature melting soldering material, a method of placing the light emitting element 3 on the array substrate 2 with conductive paste interposed therebetween and burning and bonding them, etc.

The light emitting element 3 may be mounted directly on the anode electrode 23 without the second organic insulating film 97 or the mounting electrode 24 on the array substrate 2. Providing the second organic insulating film 97 and the mounting electrode 24 can prevent the capacitance insulating film 95 from being damaged by force applied in mounting the light emitting element 3. In other words, the second organic insulating film 97 and the mounting electrode 24 can prevent dielectric breakdown caused between the anode electrode 23 and the counter electrode 25 that form the capacitance Cs2.

The light emitting element 3 includes a semiconductor layer 31, a cathode terminal 32, and an anode terminal 33. The semiconductor layer 31 has a multilayered structure of an n-type clad layer, an active layer, and a p-type clad layer. The semiconductor layer 31 is made of a compound semiconductor, such as gallium nitride (GaN), aluminum indium phosphorous (AlInP), and indium gallium nitride (InGaN). The semiconductor layer 31 may be made of different materials depending on the first light emitting element 3R, the second light emitting element 3G, and the third light emitting element 3B. The active layer may have a multi-quantum well structure (MQW structure) in which well layers and barrier layers composed of several atomic layers are cyclically layered for high efficiency. The semiconductor layer 31 may be formed on a semiconductor substrate as the light emitting element 3. The light emitting element 3 is not necessarily mounted alone on the array substrate 2, and an LED chip including the light emitting element 3 may be mounted on the array substrate 2.

The height of the first light emitting element 3R, the height of the second light emitting element 3G, and the height of the third light emitting element 3B are different from one another. Specifically, the height of the first light emitting element 3R is higher than that of the second light emitting element 3G. The height of the second light emitting element 3G is higher than that of the third light emitting element 3B. In other words, the heights increase in order of the third light emitting element 3B, the second light emitting element 3G, and the first light emitting element 3R. This is because a strain relaxing layer is provided to suppress strain in the MQW structure of the active layer. The strain relaxing layer can make the light emitting element 3 highly efficient. The thickness of the strain relaxing layer depends on the wavelength of light. Consequently, the strain relaxing layer of the first light emitting element 3R is made thicker, and the strain relaxing layer of the third light emitting element 3B is made thinner.

The relation between the height of the first light emitting element 3R, the height of the second light emitting element 3G, the height of the third light emitting element 3B, and the chip areas in planar view is different depending on the material of the semiconductor layer 31. If the first light emitting element 3R has an InGan/GaN-system structure, for example, the relation between the height of the first light emitting element 3R, the height of the second light emitting element 3G, and the height of the third light emitting element 3B is the same as described above. The chip area of the first light emitting element 3R is larger than that of the second light emitting element 3G, and the chip area of the second light emitting element 3G is larger than that of the third light emitting element 3B. If the first light emitting element 3R has an InAlGaP/GaAs-system structure, the height of the second light emitting element 3G and the height of the third light emitting element 3B are substantially equal, and the height of the first light emitting element 3R is lower than them. The chip area of the first light emitting element 3R is larger than that of the second light emitting element 3G, and the chip area of the second light emitting element 3G is larger than that of the third light emitting element 3B.

An element insulating film 98 is provided between a plurality of light emitting elements 3. The element insulating film 98 is made of resin material. The element insulating film 98 covers the side surfaces of the light emitting element 3 and has a contact hole H3 at the part overlapping the cathode terminal 32 of the light emitting element 3. The cathode terminal 32 of the light emitting element 3 is exposed from the element insulating film 98 at the bottom of the contact hole H3.

A cathode electrode 22 covers a plurality of light emitting elements 3 and the element insulating film 98 and is electrically coupled to the light emitting elements 3. More specifically, the cathode electrode 22 is provided across the upper surface of the element insulating film 98 and the upper surface of the cathode terminal 32 exposed to the contact hole H3. The cathode electrode 22 is made of translucent conductive material, such as ITO. With this configuration, the light output from the light emitting elements 3 can be efficiently extracted to the outside. The cathode electrode 22 is electrically coupled to the cathode terminals 32 of the light emitting elements 3 mounted on the display region AA. The cathode electrode 22 is coupled to the cathode wiring 60 provided on the array substrate 2 at a cathode contact portion provided outside the display region AA.

As described above, the display device 1 with the light emitting elements 3 serving as display elements is provided. The display device 1 may include a cover panel, a circularly polarizing plate, a touch panel, and other components on the cathode electrode 22 as needed. The display device 1 does not necessarily have a face-up structure in which the upper part of the light emitting element 3 is coupled to the cathode electrode 22. The display device 1 may have what is called a face-down structure in which the lower part of the light emitting element 3 is coupled to the anode electrode 23 and the cathode electrode 22.

The following describes the positions of the first light emitting element 3R, the second light emitting element 3G, and the third light emitting element 3B in greater detail. FIG.

4 is a plan view of an array of a plurality of pixels. To facilitate understanding, the planar shape (area and lengths Wx and Wy) and heights HR, HG, and HB, for example, of the light emitting elements 3 are illustrated in an emphasized manner in the figures. The size and the ratio of the units or the reduced scale in the drawings, for example, is appropriately modified. This relation, however, can be different depending on which material is selected for the semiconductor layer 31 as described above. The figures are not intended to limit the relation between the positions and the colors.

Figure 4:
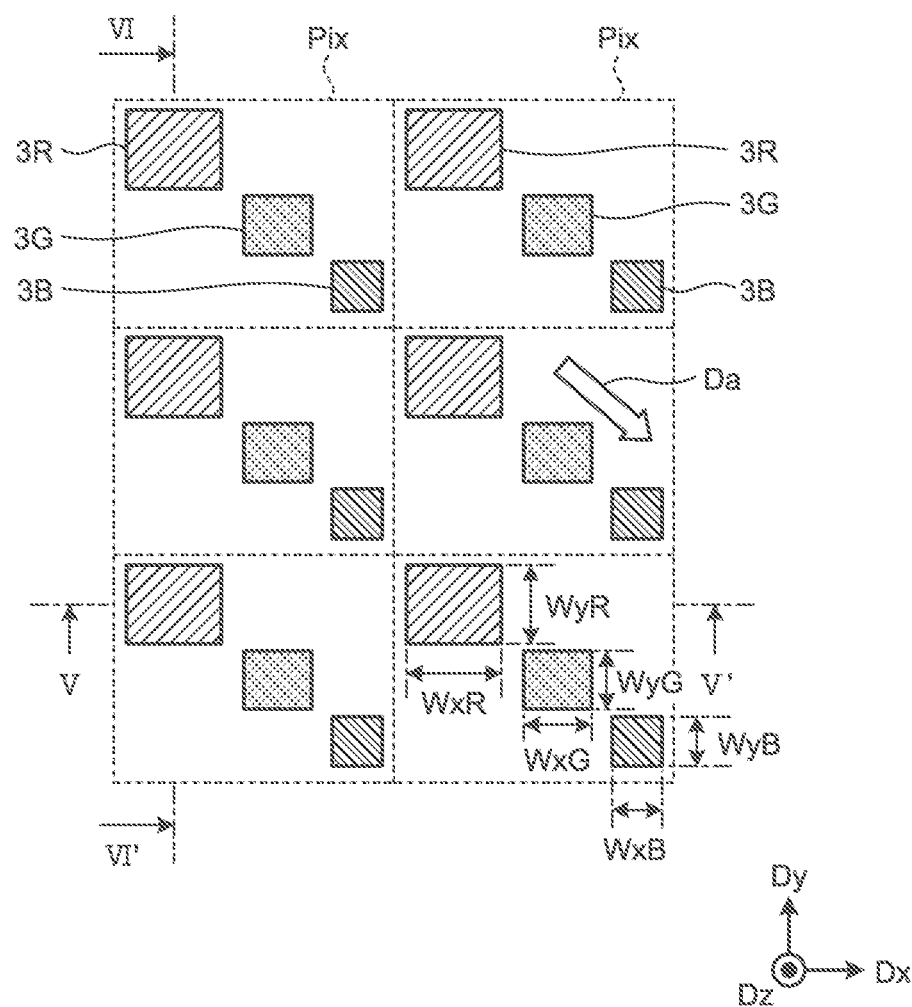
FIG. 4 is a plan view of an array of a plurality of pixels.

As illustrated in FIG. 4, the first light emitting element 3R, the second light emitting element 3G, and the third light emitting element 3B in one pixel Pix are arrayed in an oblique direction Da intersecting the first direction Dx and the second direction Dy.

In an array of a plurality of pixels Pix, the first light emitting elements 3R are arrayed in both the first direction Dx and the second direction Dy. In the first direction Dx, the second light emitting element 3G is positioned between the first light emitting elements 3R disposed side by side in the first direction Dx and between the third light emitting elements 3B disposed side by side in the first direction Dx. In the second direction Dy, the second light emitting element 3G is positioned between the first light emitting elements 3R disposed side by side in the second direction Dy and between the third light emitting elements 3B disposed side by side in the second direction Dy.

In the first direction Dx, the third light emitting element 3B is positioned between the first light emitting elements 3R disposed side by side in the first direction Dx and between the second light emitting elements 3G disposed side by side in the first direction Dx. In the second direction Dy, the third light emitting element 3B is positioned between the first light emitting elements 3R disposed side by side in the second direction Dy and between the second light emitting elements 3G disposed side by side in the second direction Dy.

In other words, when one pixel Pix is viewed in the first direction Dx, the third light emitting element 3B has a part not overlapping the first light emitting element 3R or the second light emitting element 3G. In addition, when one pixel Pix is viewed in the second direction Dy, the third light emitting element 3B has a part not overlapping the first light emitting element 3R or the second light emitting element 3G. When one pixel Pix is viewed in the first direction Dx, the second light emitting element 3G has a part not overlapping the first light emitting element 3R or the third light emitting element 3B. In addition, when one pixel Pix is viewed in the second direction Dy, the second light emitting element 3G has a part not overlapping the first light emitting element 3R or the third light emitting element 3B.

In other words, the ends of one pixel Pix facing the first direction Dx are referred to as a first end and a second end, and the ends facing the second direction Dy are referred to as a third end and a fourth end. In FIG. 4, the first end corresponds to the end of the pixel Pix in the −Dx direction, and the second end corresponds to the end of the pixel Pix in the +Dx direction. The third end corresponds to the end of the pixel Pix in the +Dy direction, and the fourth end corresponds to the end of the pixel Pix in the −Dy direction. One pixel Pix has a region provided with only the third light emitting element 3B between the first end and the second end positioned in the first direction Dx (+Dx direction). One pixel Pix has a region provided with only the third light emitting element 3B between the third end and the fourth end positioned in the second direction Dy (−Dy direction).

In planar view, the area of the first light emitting element 3R is larger than that of the second light emitting element 3G. The area of the second light emitting element 3G is larger than that of the third light emitting element 3B. Specifically, the length WxR of the first light emitting element 3R in the first direction Dx is longer than the length WxG of the second light emitting element 3G in the first direction Dx. The length WxG of the second light emitting element 3G in the first direction Dx is longer than the length WxB of the third light emitting element 3B in the first direction Dx. The length WyR of the first light emitting element 3R in the second direction Dy is longer than the length WyG of the second light emitting element 3G in the second direction Dy. The length WyG of the second light emitting element 3G in the second direction Dy is longer than the length WyB of the third light emitting element 3B in the second direction Dy.

Typically, the luminous efficacy (internal quantum efficiency) of the light emitting element 3 increases in order of the first light emitting element 3R, the second light emitting element 3G, and the third light emitting element 3B. Variations in luminous fluxes of the colors output from the respective light emitting elements 3 can be reduced by varying the areas of the first light emitting element 3R, the second light emitting element 3G, and the third light emitting element 3B in planar view as described above.

Figure 5:
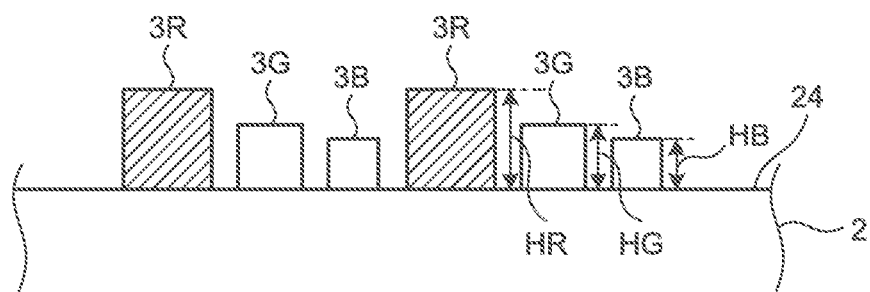
FIG. 5 is a diagram viewed from the V-V' section of FIG. 4 in the depth direction (second direction Dy in FIG. 4)
Figure 5:
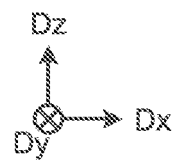

FIG. 5 is a diagram viewed from the V-V' section of FIG. 4 in the depth direction (second direction Dy in FIG. 4). FIG. 5 is a sectional view of the display device 1 along the plane defined by the first direction Dx and the third direction Dz. The sectional views in FIG. 5 and other figures illustrate the light emitting elements 3 appearing on the section and the light emitting elements 3 positioned behind the section in a transmissive manner. As illustrated in FIG. 5, in sectional view seen from the second direction Dy, the light emitting elements 3 are repeatedly arrayed in the first direction Dx in order of the first light emitting element 3R, the second light emitting element 3G, the third light emitting element 3B, the first light emitting element 3R, the second light emitting element 3G, and the third light emitting element 3B. In sectional view seen from the second direction Dy, the third light emitting element 3B is provided between the first light emitting element 3R and the second light emitting element 3G and exposed from the first light emitting element 3R and the second light emitting element 3G. The second light emitting element 3G is provided between the first light emitting element 3R and the third light emitting element 3B and exposed from the first light emitting element 3R and the third light emitting element 3B.

As described above, the height HR of the first light emitting element 3R is higher than the height HG of the second light emitting element 3G. The height HG of the second light emitting element 3G is higher than the height HB of the third light emitting element 3B. The heights HR, HG, and HB are the height in the third direction Dz between the bottom surface of the anode terminal 33 and the upper surface of the cathode terminal 32. The height positions of the mounting electrodes 24 on which the light emitting elements 3 are mounted are uniform. As a result, the height positions of the upper surfaces (output surfaces) of the first light emitting element 3R, the second light emitting element 3G, and the third light emitting element 3B are different from one another.

Figure 6:
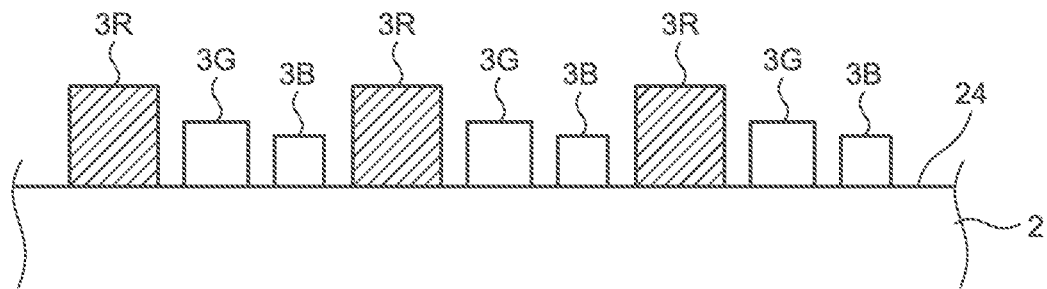
FIG. 6 is a diagram viewed from the VI-VI' section of FIG. 4 in the depth direction (first direction Dx in FIG. 4)
Figure 6:
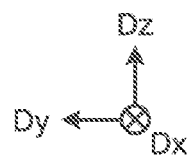

FIG. 6 is a diagram viewed from the VI-VI' section of FIG. 4 in the depth direction (first direction Dx in FIG. 4). FIG. 6 is a sectional view of the display device 1 along the plane defined by the second direction Dy and the third direction Dz. As illustrated in FIG. 6, in sectional view seen from the first direction Dx (−Dx direction), the light emitting elements 3 are repeatedly arrayed in the second direction Dy in order of the third light emitting element 3B, the second light emitting element 3G, the first light emitting element 3R, the third light emitting element 3B, the second light emitting element 3G, and the first light emitting element 3R. In sectional view seen from the first direction Dx, the third light emitting element 3B is provided between the first light emitting element 3R and the second light emitting element 3G and exposed from the first light emitting element 3R and the second light emitting element 3G. The second light emitting element 3G is provided between the first light emitting element 3R and the third light emitting element 3B and exposed from the first light emitting element 3R and the third light emitting element 3B.

With this configuration, if the height HG of the second light emitting element 3G and the height HB of the third light emitting element 3B are lower than the height HR of the first light emitting element 3R, at least part of the second light emitting element 3G and part of the third light emitting element 3B are exposed without overlapping other light emitting elements 3 when viewed in the first direction Dx and the second direction Dy. Consequently, the display device 1 can prevent the light output from the second light emitting element 3G or the third light emitting element 3B from being blocked by other light emitting elements 3, thereby preventing the display property from deteriorating. If an observer observes the display device 1 at a viewing angle of approximately 90° with respect to the third direction Dz (a polar angle of) 0° in the first direction Dx and the second direction Dy in which the display device 1 is frequently observed, the display device 1 can prevent the first light emitting element 3R, the second light emitting element 3G, and the third light emitting element 3B from being completely hidden behind the light emitting elements 3 that output light of other colors.

The positions of the first light emitting element 3R, the second light emitting element 3G, and the third light emitting element 3B may be appropriately modified. The order of the positions of the light emitting elements 3 in the oblique direction Da, for example, is not limited to the order of the first light emitting element 3R, the second light emitting element 3G, and the third light emitting element 3B and may be another order. While the first light emitting element 3R, the second light emitting element 3G, and the third light emitting element 3B are separated from one another in FIGS. 5 and 6, the present embodiment is not limited thereto. The light emitting elements 3 simply need to have a part not overlapping the light emitting elements 3 that output light of other colors when viewed in the first direction Dx and the second direction Dy. The light emitting elements 3 may be disposed such that the first light emitting element 3R, the second light emitting element 3G, and the third light emitting element 3B partially overlap one another.

In mounting the light emitting elements 3 on the array substrate 2, they are preferably mounted in order of the third light emitting element 3B, the second light emitting element 3G, and the first light emitting element 3R because the heights HR, HG, and HB of the respective light emitting elements 3 are different. This method can prevent the previously mounted third light emitting element 3B or second light emitting element 3G from coming into contact with other members, such as a semiconductor substrate and a transfer substrate, provided with the light emitting elements 3 in the subsequent mounting.

Second Embodiment

Figure 7:
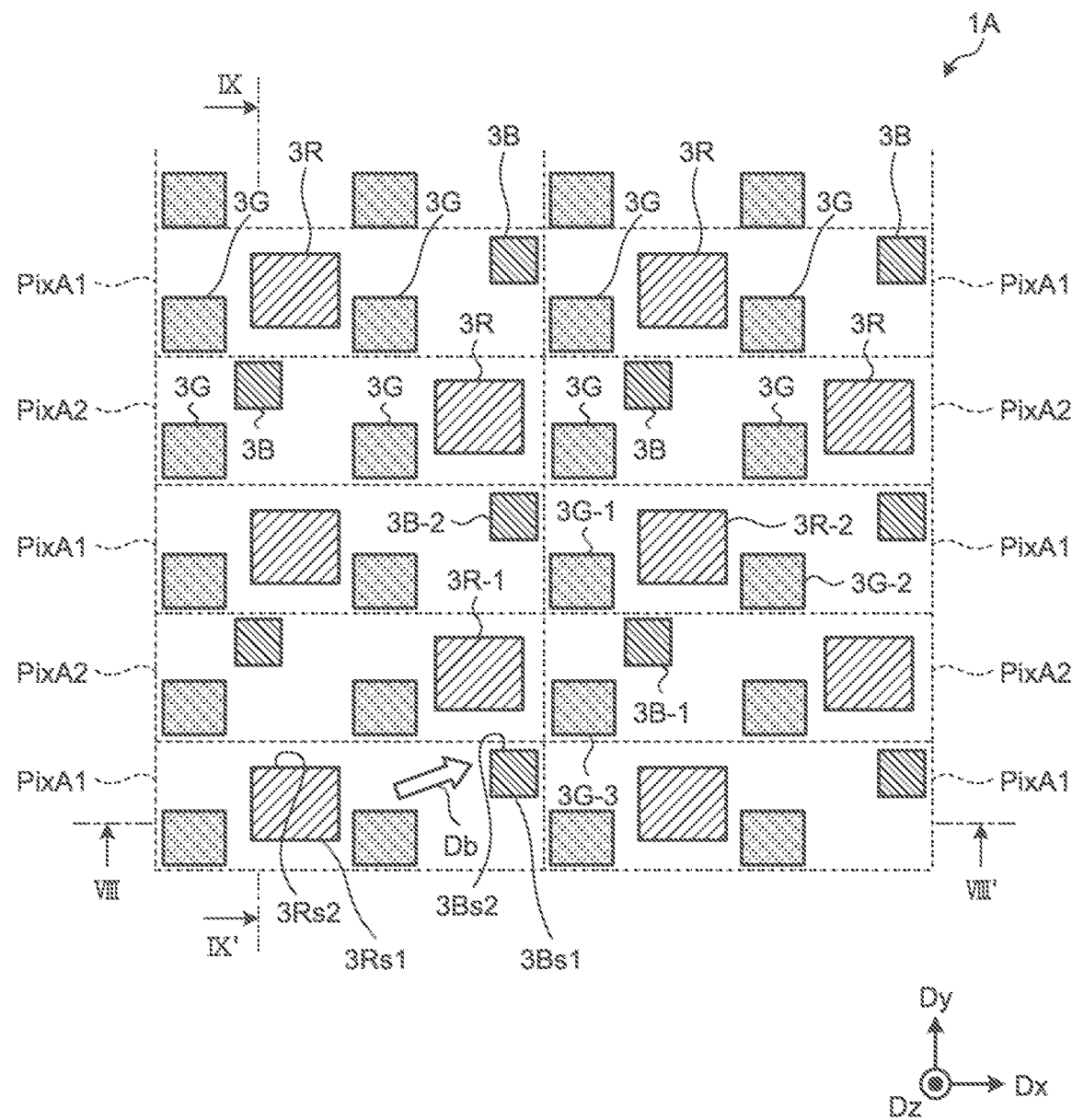
FIG. 7 is a plan view of an array of a plurality of pixels in the display device according to a second embodiment.

FIG. 7 is a plan view of an array of a plurality of pixels in the display device according to a second embodiment. In the following description, the same components as those described in the embodiment above are denoted by like reference numerals, and overlapping explanation thereof is omitted.

As illustrated in FIG. 7, a display device 1A according to the second embodiment includes first pixels PixA1 and second pixels PixA2 alternately arrayed in the second direction Dy. The first pixels PixA1 and the second pixels PixA2 are each arrayed in the first direction Dx. The first pixels PixA1 and the second pixels PixA2 are formed in what is called the PenTile array.

The first pixel PixA1 and the second pixel PixA2 each include one first light emitting element 3R, two second light emitting elements 3G, and one third light emitting element 3B. In the first pixel PixA1, the light emitting elements 3 are separately arrayed in the first direction Dx in order of the second light emitting element 3G, the first light emitting element 3R, the second light emitting element 3G, and the third light emitting element 3B. In the second pixel PixA2, the light emitting elements 3 are separately arrayed in the first direction Dx in order of the second light emitting element 3G, the third light emitting element 3B, the second light emitting element 3G, and the first light emitting element 3R.

Alternatively, let us assume a case where the first light emitting element 3R and the second light emitting element 3G disposed side by side are defined as a first light emitting element group, and the third light emitting element 3B and the second light emitting element 3G disposed side by side are defined as a second light emitting element group. The first pixel PixA1 and the second pixel PixA2 each include the first light emitting element group and the second light emitting element group disposed side by side in the first direction Dx. The order of the first light emitting element group and the second light emitting element group is opposite between the first pixel PixA1 and the second pixel PixA2.

In the first pixel PixA1, the two second light emitting elements 3G are disposed side by side in the first direction Dx at the same position in the second direction Dy. The position of the first light emitting element 3R in the second direction Dy deviates from the position of the second light emitting elements 3G in the second direction Dy. In other words, a first side surface 3Rs1 of the first light emitting element 3R in the second direction Dy is positioned between the second light emitting elements 3G disposed side by side in the first direction Dx. A second side surface 3Rs2 of the first light emitting element 3R in the second direction Dy is positioned in the second direction Dy (+Dy direction) with respect to the second light emitting elements 3G.

In the first pixel PixA1, the position of the third light emitting element 3B in the second direction Dy deviates from the positions of the second light emitting elements 3G and the first light emitting element 3R in the second direction Dy. The third light emitting element 3B is disposed in an oblique direction Db with respect to the first light emitting element 3R. In other words, the position of a first side surface 3Bs1 of the third light emitting element 3B in the second direction Dy is positioned in the second direction Dy (+Dy direction) with respect to the second light emitting elements 3G and overlaps the position of the first light emitting element 3R in the second direction Dy. The position of a second side surface 3Bs2 in the second direction Dy is positioned in the second direction Dy (+Dy direction) with respect to the second side surface 3Rs2 of the first light emitting elements 3R.

In other words, when one first pixel PixA1 is viewed in the first direction Dx, the third light emitting element 3B has a part (second side surface 3Bs2) not overlapping the first light emitting element 3R or the second light emitting elements 3G. In addition, when one first pixel PixA1 is viewed in the second direction Dy, the third light emitting element 3B has a part not overlapping the first light emitting element 3R or the second light emitting elements 3G. When one first pixel PixA1 is viewed in the first direction Dx, the second light emitting elements 3G have a part (first side surface) not overlapping the first light emitting element 3R or the third light emitting element 3B. In addition, when one pixel Pix is viewed in the second direction Dy, the second light emitting elements 3G have a part not overlapping the first light emitting element 3R or the third light emitting element 3B.

The second pixel PixA2 has a configuration obtained by switching the first light emitting element 3R and the third light emitting element 3B in the first pixel PixA1. The positional relation among the light emitting elements 3 in the second direction Dy in one second pixel PixA2 is the same as that in the first pixel PixA1, and detailed explanation thereof is omitted. In a plurality of first pixels PixA1 and a plurality of second pixels PixA2 arrayed in the second direction Dy, the second light emitting elements 3G are disposed side by side in the second direction Dy at the same position in the first direction Dx. The first light emitting elements 3R and the third light emitting elements 3B are alternately disposed in the second direction Dy. The first light emitting element 3R and the third light emitting element 3B are disposed in a manner deviating from each other in the first direction Dx.

The following describes the positional relation among a plurality of light emitting elements 3 using a third light emitting element 3B-1 illustrated in FIG. 7 as an example. In the first direction Dx, at least part of the third light emitting element 3B-1 (e.g., the side surface in the −Dx direction) is positioned between first light emitting elements 3R-1 and 3R-2 disposed side by side in the first direction Dx and between second light emitting elements 3G-1 and 3G-2 disposed side by side in the first direction Dx.

In the second direction Dy, at least part of the third light emitting element 3B-1 (e.g., the second side surface 3Bs2) is positioned between the first light emitting elements 3R-1 and 3R-2 disposed side by side in the second direction Dy and between the second light emitting elements 3G-1 and 3G-3 disposed side by side in the second direction Dy. The light emitting elements 3 disposed side by side in the first direction Dx indicate the light emitting elements 3 having the shortest distance therebetween in the first direction Dx out of the light emitting elements 3. Similarly, the light emitting elements 3 disposed side by side in the second direction Dy indicate the light emitting elements 3 having the shortest distance therebetween in the second direction Dy.

The following describes the positional relation among a plurality of light emitting elements 3 using a second light emitting element 3G-1 as an example. In the first direction Dx, at least part of the second light emitting element 3G-1 is positioned between the first light emitting elements 3R-1 and 3R-2 disposed side by side in the first direction Dx and between the third light emitting elements 3B-1 and 3B-2 disposed side by side in the first direction Dx.

In the second direction Dy, at least part of the second light emitting element 3G-1 (e.g., the side surface in the −Dy direction) is positioned between the first light emitting elements 3R-1 and 3R-2 disposed side by side in the second direction Dy and between the third light emitting elements 3B-1 and 3B-2 disposed side by side in the second direction Dy.

The relations of the area, the shape (lengths Wx and Wy), and the like between the first light emitting element 3R, the second light emitting element 3G, and the third light emitting element 3B in planar view are the same as the first embodiment, and detailed explanation thereof is omitted.

Figure 8:
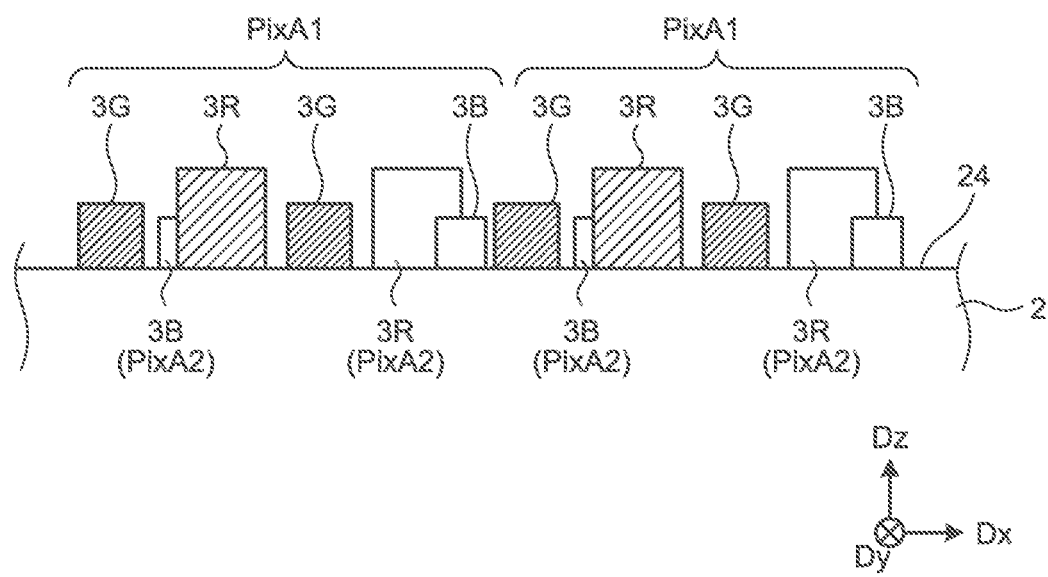
FIG. 8 is a diagram viewed from the VIII-VIII' section of FIG. 7 in the depth direction (second direction Dy in FIG. 7)

FIG. 8 is a diagram viewed from the VIII-VIII' section of FIG. 7 in the depth direction (second direction Dy in FIG. 7). FIG. 8 is a sectional view of the display device 1A along the first direction Dx in the first pixel PixA1. As illustrated in FIG. 8, in sectional view seen from the second direction Dy, the light emitting elements 3 are repeatedly arrayed in the first direction Dx in order of the second light emitting element 3G, the third light emitting element 3B, the first light emitting element 3R, the second light emitting element 3G, the first light emitting element 3R, and the third light emitting element 3B.

In sectional view seen from the second direction Dy, the third light emitting element 3B is exposed from the first light emitting element 3R and the second light emitting element 3G. More specifically, part of the third light emitting element 3B of the second pixel PixA2 is disposed overlapping the first light emitting element 3R of the first pixel PixA1. Part of the third light emitting element 3B (side surface in the −Dx direction) of the second pixel PixA2 is exposed between the first light emitting element 3R and the second light emitting element 3G of the first pixel PixA1. Part of the third light emitting element 3B of the first pixel PixA1 is exposed between the first light emitting element 3R of the second pixel PixA2 and the second light emitting element 3G of the first pixel PixA1. The second light emitting element 3G is provided between the first light emitting elements 3R disposed side by side or between the third light emitting elements 3B disposed side by side and is exposed from the first light emitting element 3R and the third light emitting element 3B.

Figure 9:
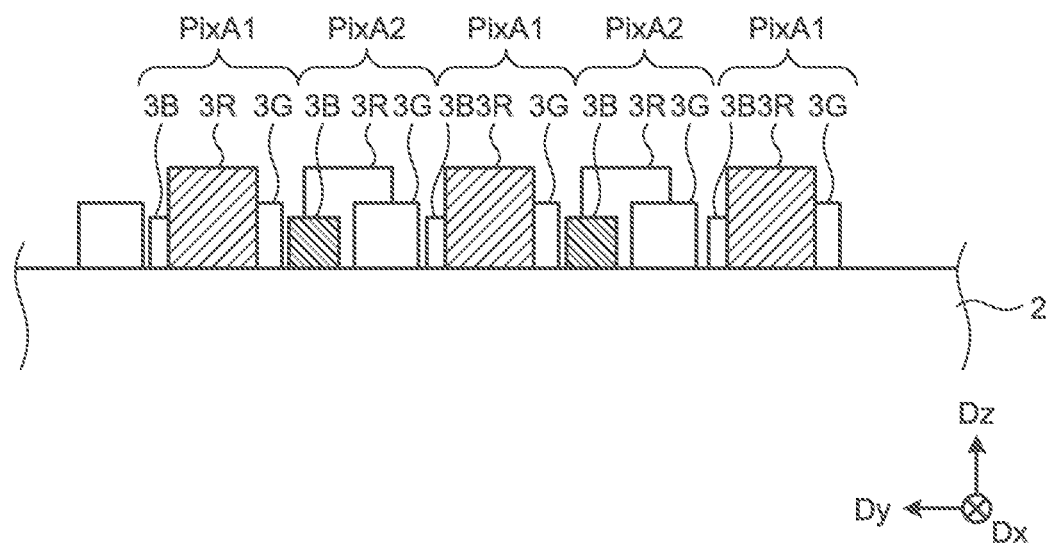
FIG. 9 is a diagram viewed from the IX-IX' section of FIG. 7 in the depth direction (first direction Dx in FIG. 7)

FIG. 9 is a diagram viewed from the IX-IX' section of FIG. 7 in the depth direction (first direction Dx in FIG. 7). FIG. 9 is a sectional view of the display device 1A along the second direction Dy. As illustrated in FIG. 9, in sectional view seen from the first direction Dx, the light emitting elements 3 are repeatedly arrayed in the second direction Dy in order of the second light emitting element 3G, the first light emitting element 3R, the third light emitting element 3B, the second light emitting element 3G, the first light emitting element 3R, and the third light emitting element 3B. In sectional view seen from the first direction Dx, at least part of the third light emitting element 3B is exposed from the first light emitting element 3R and the second light emitting element 3G. At least part of the second light emitting element 3G is exposed from the first light emitting element 3R and the third light emitting element 3B.

More specifically, part of the second light emitting element 3G and part of the third light emitting element 3B of the first pixel PixA1 are disposed overlapping the first light emitting element 3R of the first pixel PixA1. Part of the second light emitting element 3G of the first pixel PixA1 is exposed between the first side surface 3Rs1 of the first light emitting element 3R and the third light emitting element 3B of the second pixel PixA2. Part of the third light emitting element 3B of the first pixel PixA1 is exposed between the second side surface 3Rs2 of the first light emitting element 3R and the second light emitting element 3G of the second pixel PixA2.

Also in the display device 1A having a pixel configuration of what is called the PenTile array, at least part of the second light emitting element 3G and part of the third light emitting element 3B do not overlap other light emitting elements 3 when viewed in the first direction Dx and the second direction Dy. Consequently, the display device 1A can prevent the display property from deteriorating. The display device 1A requires less number of first light emitting elements 3R and third light emitting elements 3B than the number of second light emitting elements 3G while maintaining display resolution.

Third Embodiment

Figure 10:
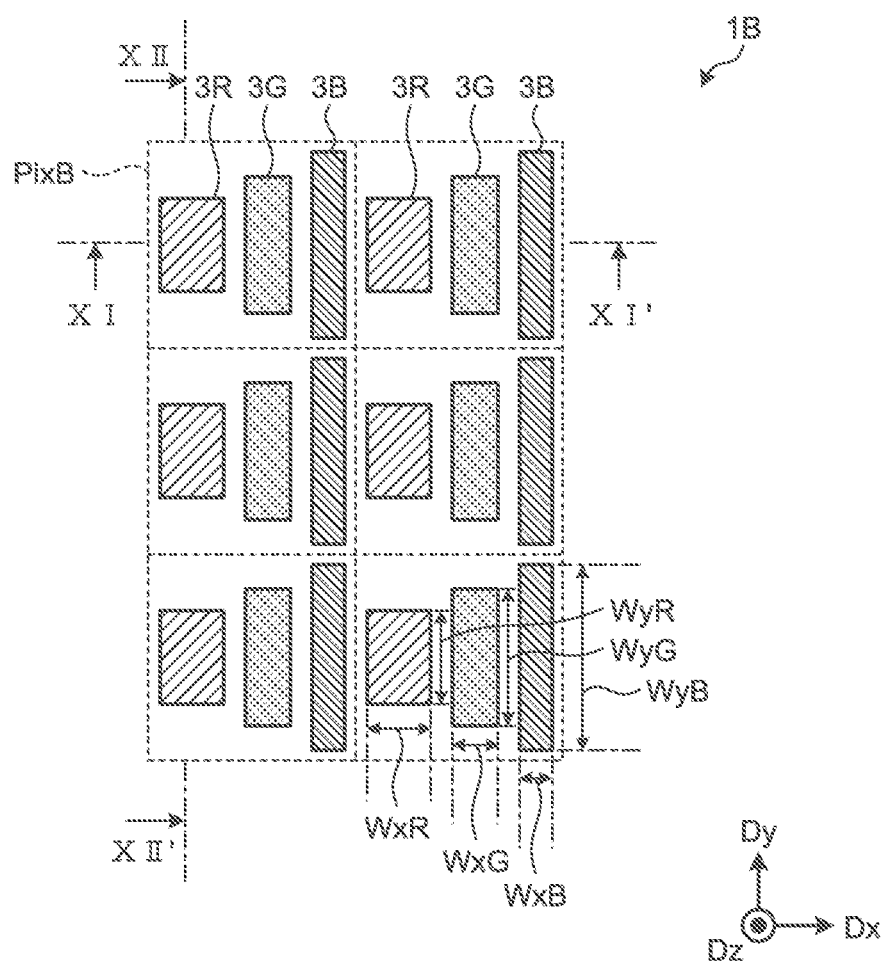
FIG. 10 is a plan view of an array of a plurality of pixels in the display device according to a third embodiment.

FIG. 10 is a plan view of an array of a plurality of pixels in the display device according to a third embodiment. As illustrated in FIG. 10, in one pixel PixB, the light emitting elements 3 are arrayed in the first direction Dx in order of the first light emitting element 3R, the second light emitting element 3G, and the third light emitting element 3B.

In an array of a plurality of pixels PixB, the first light emitting elements 3R are arrayed in the second direction Dy. In the same manner, the second light emitting elements 3G are arrayed in the second direction Dy, and the third light emitting elements 3B are arrayed in the second direction Dy. The length WxR of the first light emitting element 3R in the first direction Dx is longer than the length WxG of the second light emitting element 3G in the first direction Dx. The length WxG of the second light emitting element 3G in the first direction Dx is longer than the length WxB of the third light emitting element 3B in the first direction Dx. The length WyR of the first light emitting element 3R in the second direction Dy is shorter than the length WyG of the second light emitting element 3G in the second direction Dy. The length WyG of the second light emitting element 3G in the second direction Dy is shorter than the length WyB of the third light emitting element 3B in the second direction Dy. In other words, the first light emitting element 3R, the second light emitting element 3G, and the third light emitting element 3B are made longer in order of the length WyR, the length WyG, and the length WyB in the second direction Dy.

With this configuration, in the first direction Dx, the second light emitting element 3G is positioned between the first light emitting element 3R and the third light emitting element 3B disposed side by side in the first direction Dx. In the second direction Dy, the second light emitting element 3G overlaps the position of the first light emitting element 3R and the third light emitting element 3B disposed side by side with the second light emitting element 3G in the first direction Dx. When one pixel PixB is viewed in the first direction Dx, the second light emitting element 3G has a part (the first side surface and the second side surface facing the second direction Dy) not overlapping the first light emitting element 3R or the third light emitting element 3B.

In the first direction Dx, the third light emitting element 3B is positioned between the second light emitting element 3G and the first light emitting element 3R disposed side by side in the first direction Dx. In the second direction Dy, the third light emitting element 3B overlaps the position of the first light emitting element 3R and the second light emitting element 3G. When one pixel PixB is viewed in the first direction Dx, the third light emitting element 3B has a part (the first side surface 3Bs1 and the second side surface 3Bs2 facing the second direction Dy) not overlapping the first light emitting element 3R or the second light emitting element 3G.

Figure 11:
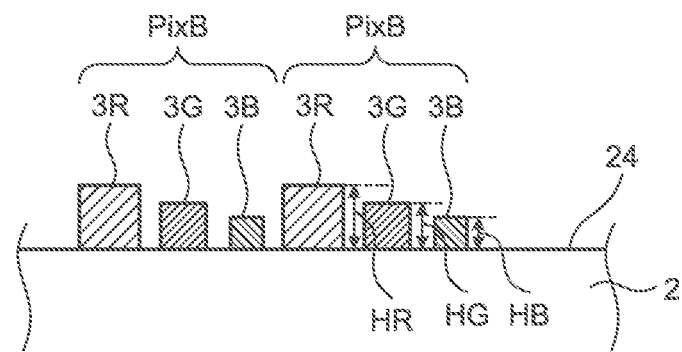
FIG. 11 is a diagram viewed from the XI-XI' section of FIG. 10 in the depth direction (second direction Dy in FIG. 10)
Figure 11:
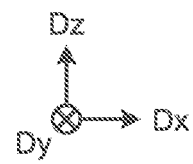

FIG. 11 is a diagram viewed from the XI-XI' section of FIG. 10 in the depth direction (second direction Dy in FIG. 10). FIG. 11 is a sectional view of a display device 1B along the first direction Dx. As illustrated in FIG. 11, in sectional view seen from the second direction Dy, the light emitting elements 3 are repeatedly arrayed in the first direction Dx in order of the first light emitting element 3R, the second light emitting element 3G, the third light emitting element 3B, the first light emitting element 3R, the second light emitting element 3G, and the third light emitting element 3B. In sectional view seen from the second direction Dy, the third light emitting element 3B is provided between the first light emitting element 3R and the second light emitting element 3G and exposed from the first light emitting element 3R and the second light emitting element 3G. The second light emitting element 3G is provided between the first light emitting element 3R and the third light emitting element 3B and exposed from the first light emitting element 3R and the third light emitting element 3B.

Figure 12:
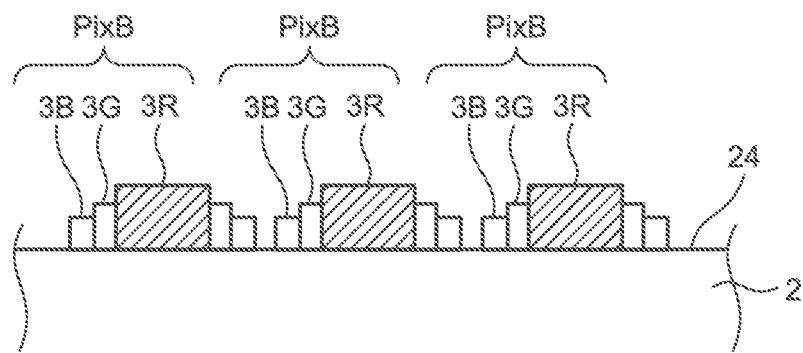
FIG. 12 is a diagram viewed from the XII-XII' section of FIG. 10 in the depth direction (first direction Dx in FIG. 10)
Figure 12:
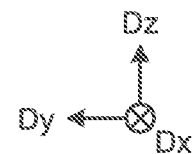

FIG. 12 is a diagram viewed from the XII-XII' section of FIG. 10 in the depth direction (first direction Dx in FIG. 10). FIG. 12 is a sectional view of the display device 1B along the second direction Dy. As illustrated in FIG. 12, in sectional view seen from the first direction Dx, the first light emitting element 3R, the second light emitting element 3G, and the third light emitting element 3B of each pixel PixB are disposed overlapping one another. At least part of the second light emitting element 3G (the first side surface and the second side surface facing the second direction Dy) is exposed from the first side surface 3Rs1 and the second side surface 3Rs2 of the first light emitting element 3R. At least part of the third light emitting element 3B (the first side surface and the second side surface facing the second direction Dy) is exposed from the first side surface and the second side surface of the second light emitting element 3G.

Also in sectional view seen from the opposite direction (+Dx direction) opposite to that in FIG. 12, the first light emitting element 3R, the second light emitting element 3G, and the third light emitting element 3B are disposed overlapping one another. Also in this case, the height HR of the first light emitting element 3R is higher than the height HG of the second light emitting element 3G. As a result, at least part of the first light emitting element 3R (upper surface) does not overlap the second light emitting element 3G or the third light emitting element 3B. The height HG of the second light emitting element 3G is higher than the height HB of the third light emitting element 3B. As a result, at least part of the second light emitting element 3G (upper surface) does not overlap the third light emitting element 3B.

With this configuration, if the first light emitting element 3R, the second light emitting element 3G, and the third light emitting element 3B are arrayed in the first direction Dx, at least part of the second light emitting element 3G and part of the third light emitting element 3B do not overlap other light emitting elements 3 when viewed in the first direction Dx and the second direction Dy by varying the shape of the light emitting elements 3 (the length Wy in the second direction Dy and the heights HR, HG, and HB). While the first light emitting element 3R, the second light emitting element 3G, and the third light emitting element 3B according to the third embodiment are disposed with the positions of their middle points in the second direction Dy aligned, the present embodiment is not limited thereto. The first light emitting element 3R, the second light emitting element 3G, and the third light emitting element 3B may be disposed such that the positions of their side surfaces facing the second direction Dy are aligned, for example.

Fourth Embodiment

Figure 13:
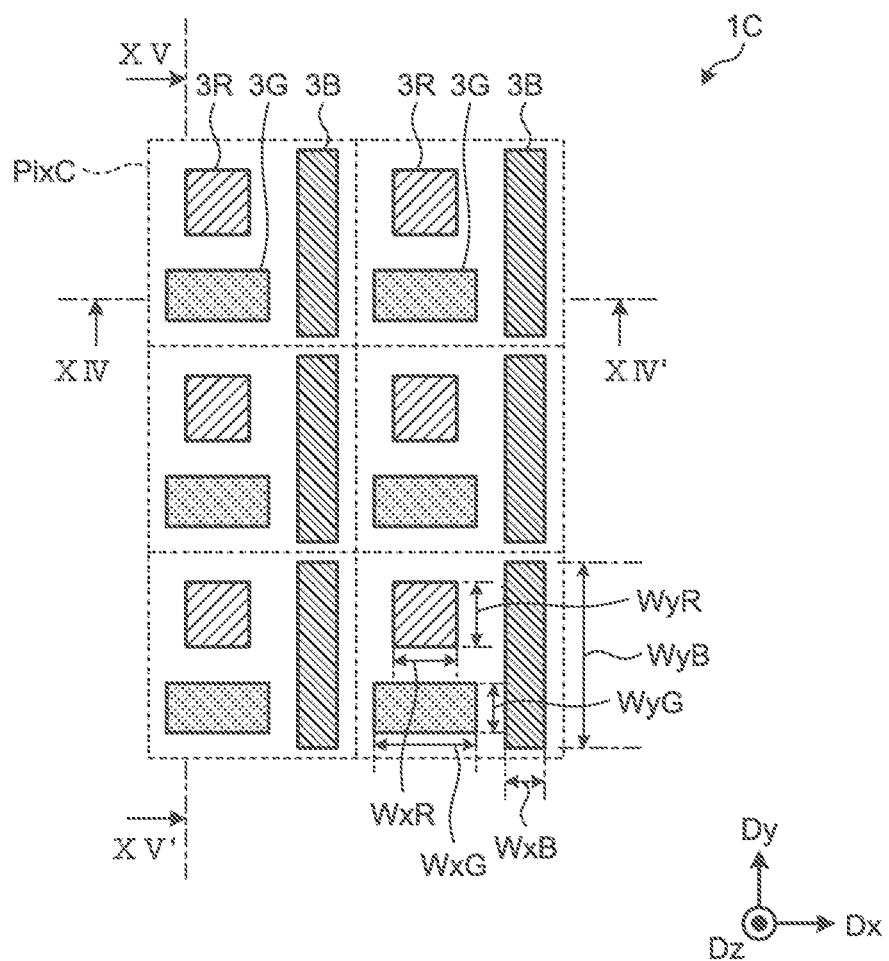
FIG. 13 is a plan view of an array of a plurality of pixels in the display device according to a fourth embodiment.

FIG. 13 is a plan view of an array of a plurality of pixels in the display device according to a fourth embodiment. As illustrated in FIG. 13, in one pixel PixC, the first light emitting element 3R and the second light emitting element 3G are disposed side by side in the second direction Dy. One third light emitting element 3B is disposed side by side with the two light emitting elements 3 (the first light emitting element 3R and the second light emitting element 3G) in the first direction Dx.

In an array of a plurality of pixels PixC, the first light emitting elements 3R and the second light emitting elements 3G are alternately arrayed in the second direction Dy. The third light emitting elements 3B are arrayed in the second direction Dy.

The length WxR of the first light emitting element 3R in the first direction Dx is shorter than the length WxG of the second light emitting element 3G in the first direction Dx. The length WxB of the third light emitting element 3B in the first direction Dx is shorter than the length WxR of the first light emitting element 3R in the first direction Dx. The length WyR of the first light emitting element 3R in the second direction Dy is longer than the length WyG of the second light emitting element 3G in the second direction Dy. The length WyB of the third light emitting element 3B in the second direction Dy is longer than the length WyR of the first light emitting element 3R in the second direction Dy. The length WyB of the third light emitting element 3B in the second direction Dy according to the present embodiment is longer than the total of the length WyR of the first light emitting element 3R in the second direction Dy and the length WyG of the second light emitting element 3G in the second direction Dy.

With this configuration, in the first direction Dx, the second light emitting element 3G is positioned between the third light emitting elements 3B disposed side by side in the first direction Dx and overlaps the position of the first light emitting element 3R in the first direction Dx. When one pixel PixC is viewed in the second direction Dy, the second light emitting element 3G has a part (the side surfaces facing the first direction Dx) not overlapping the first light emitting element 3R or the third light emitting element 3B. In the second direction Dy, the second light emitting element 3G is positioned between the first light emitting elements 3R disposed side by side in the second direction Dy and overlaps the position of the third light emitting element 3B in the second direction Dy.

In the first direction Dx, the third light emitting element 3B is positioned between the second light emitting elements 3G disposed side by side in the first direction Dx and positioned between the first light emitting elements 3R disposed side by side in the first direction Dx. The third light emitting element 3B overlaps the position of the first light emitting element 3R and the second light emitting element 3G in the second direction Dy. When one pixel PixC is viewed in the first direction Dx, the third light emitting element 3B has a part (the first side surface and the second side surface facing the second direction Dy and the center part positioned between the first light emitting element 3R and the second light emitting element 3G) not overlapping the first light emitting element 3R or the second light emitting element 3G.

Figure 14:
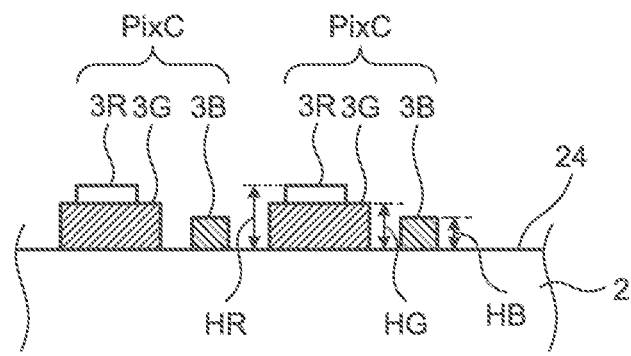
FIG. 14 is a diagram viewed from the XIV-XIV' section of FIG. 13 in the depth direction (second direction Dy in FIG. 13)
Figure 14:
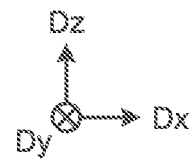

FIG. 14 is a diagram viewed from the XIV-XIV' section of FIG. 13 in the depth direction (second direction Dy in FIG. 13). FIG. 14 is a sectional view of a display device 1C along the first direction Dx. As illustrated in FIG. 14, in sectional view seen from the second direction Dy, the first light emitting element 3R and the second light emitting element 3G are provided overlapping each other. The first light emitting element 3R and the second light emitting element 3G, and the third light emitting element 3B are repeatedly arrayed in the first direction Dx. In sectional view seen from the second direction Dy, the third light emitting element 3B is provided between the first light emitting elements 3R and between the second light emitting elements 3G and exposed from the first light emitting element 3R and the second light emitting element 3G.

The second light emitting element 3G is provided between the third light emitting elements 3B and exposed from the first light emitting element 3R and the third light emitting element 3B. At least part of the first light emitting element 3R (upper surface) is exposed from the second light emitting element 3G. In sectional view seen from the opposite direction (+Dy direction) opposite to that in FIG. 14, the second light emitting element 3G is provided overlapping the first light emitting element 3R, but at least part of the second light emitting element 3G (the side surfaces facing the first direction Dx) is exposed from the first light emitting element 3R.

Figure 15:
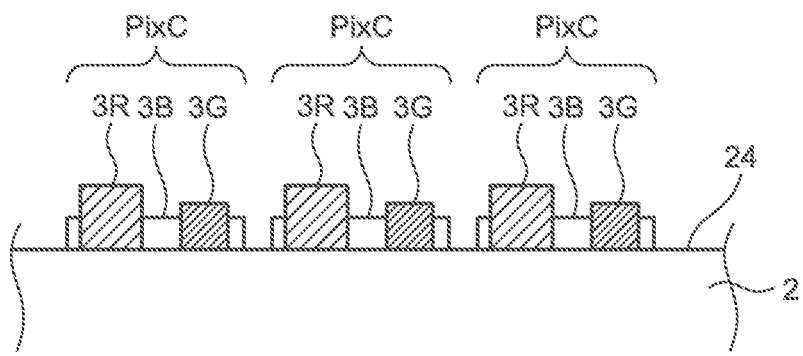
FIG. 15 is a diagram viewed from the XV-XV' section of FIG. 13 in the depth direction (first direction Dx in FIG. 13)
Figure 15:
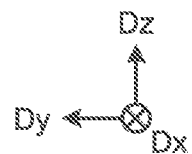

FIG. 15 is a diagram viewed from the XV-XV' section of FIG. 13 in the depth direction (first direction Dx in FIG. 13). FIG. 15 is a sectional view of the display device 1C along the second direction Dy. As illustrated in FIG. 15, in sectional view seen from the first direction Dx, the first light emitting element 3R and the second light emitting element 3G of each pixel PixC are disposed overlapping the third light emitting element 3B. At least part of the third light emitting element 3B (the first side surface and the second side surface facing the second direction Dy and the center part) is exposed from the first light emitting element 3R and the second light emitting element 3G.

When viewed from the opposite direction (+Dx direction) opposite to that in FIG. 15, part of the first light emitting element 3R and part of the second light emitting element 3G are hidden behind the third light emitting element 3B. Also in this case, the height HR of the first light emitting element 3R and the height HG of the second light emitting element 3G are higher than the height HB of the third light emitting element 3B. As a result, at least part of the first light emitting element 3R (upper surface) and at least part of the second light emitting element 3G (upper surface) do not overlap the third light emitting element 3B.

With this configuration, if two light emitting elements 3 (the first light emitting element 3R and the second light emitting element 3G) and one third light emitting element 3B are disposed side by side in the first direction Dx, at least part of the second light emitting element 3G and part of the third light emitting element 3B are exposed in sectional view seen from the first direction Dx and sectional view seen from the second direction Dy.

Fifth Embodiment

Figure 16:
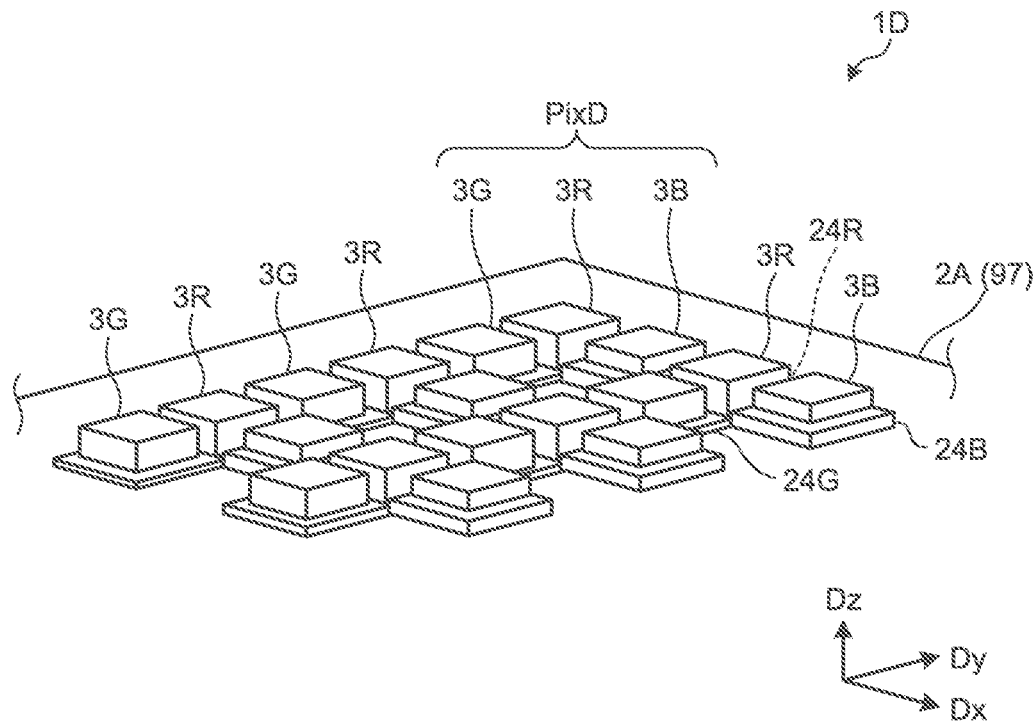
FIG. 16 is a perspective view of an array of a plurality of pixels in the display device according to a fifth embodiment.
Figure 17:
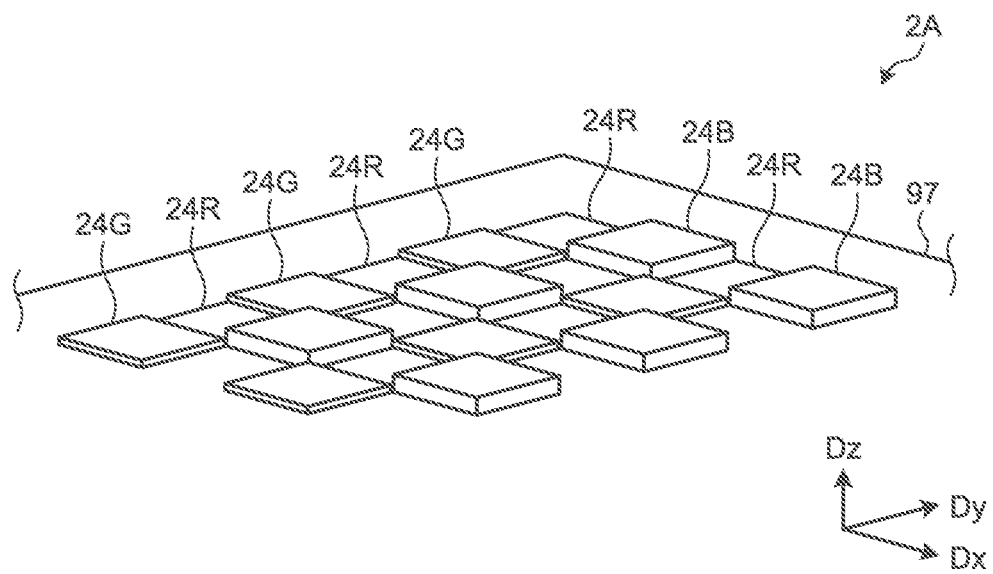
FIG. 17 is a perspective view of an array substrate of the display device according to the fifth embodiment.

FIG. 16 is a perspective view of an array of a plurality of pixels in the display device according to a fifth embodiment. FIG. 17 is a perspective view of the array substrate of the display device according to the fifth embodiment. FIG. 16 and FIG. 17 are schematics for explaining the configuration of a plurality of light emitting elements 3 and mounting electrodes 24R, 24G, and 24B of an array substrate 2A. While the first embodiment to the fourth embodiment describe the configurations in which the height positions of the mounting electrodes 24 of the array substrate 2 are uniform, the present disclosure is not limited thereto. In a display device 1D according to the fifth embodiment, the thicknesses of the mounting electrodes 24R, 24G, and 24B are different from one another.

Specifically, in a pixel PixD, the first light emitting element 3R and the second light emitting element 3G are disposed side by side in the second direction Dy. The first light emitting element 3R and the third light emitting element 3B are disposed side by side in the first direction Dx. As described above, the height HR of the first light emitting element 3R is higher than the height HG of the second light emitting element 3G. The height HG of the second light emitting element 3G is higher than the height HB of the third light emitting element 3B. The first light emitting element 3R, the second light emitting element 3G, and the third light emitting element 3B are mounted on the mounting electrodes 24R, 24G, and 24B, respectively.

As illustrated in FIG. 17, the thickness of the mounting electrode 24R is thinner than that of the mounting electrode 24G. The thickness of the mounting electrode 24G is thinner than that of the mounting electrode 24B. The difference in thickness between the mounting electrodes 24R, 24G, and 24B absorbs the difference in height between the light emitting elements 3. In other words, as illustrated in FIG. 16, when the light emitting elements 3 are mounted on the mounting electrodes 24R, 24G, and 24B, the height positions of the upper surfaces (output surfaces) of the first light emitting element 3R, the second light emitting element 3G, and the third light emitting element 3B are made uniform. As a result, the upper surfaces (output surfaces) of the light emitting elements 3 are disposed to form the same plane.

With this configuration, if the display device 1D is observed at a high viewing angle of approximately 90°, the display device 1D can prevent the third light emitting element 3B from being completely hidden behind other light emitting elements 3. As a result, at least part of the first light emitting element 3R, part of the second light emitting element 3G, and part of the third light emitting element 3B are exposed.

Modifications

Figure 18:
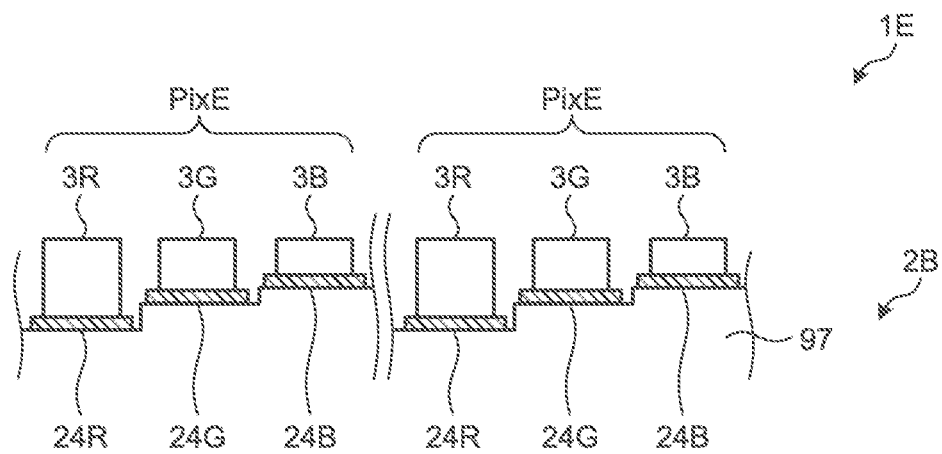
FIG. 18 is a sectional view schematically illustrating the display device according to a modification of the fifth embodiment.

FIG. 18 is a sectional view schematically illustrating the display device according to a modification of the fifth embodiment. As illustrated in FIG. 18, in a display device 1E according to the modification, the thickness of the second organic insulating film 97 varies depending on the regions provided with the first light emitting element 3R, the second light emitting element 3G, and the third light emitting element 3B. The thicknesses of the mounting electrodes 24R, 24G, and 24B are made uniform.

Specifically, the thickness of the second organic insulating film 97 in the region provided with the first light emitting element 3R is thinner than that of the second organic insulating film 97 in the region provided with the second light emitting element 3G. The thickness of the second organic insulating film 97 in the region provided with the second light emitting element 3G is thinner than that of the second organic insulating film 97 in the region provided with the third light emitting element 3B. In other words, the thickness of the second organic insulating film 97 increases in order of the first light emitting element 3R, the second light emitting element 3G, and the third light emitting element 3B. Also in this configuration, the upper surfaces (output surfaces) of the light emitting elements 3 are disposed to form the same plane.

In a pixel PixE according to the modification, the first light emitting element 3R, the second light emitting element 3G, and the third light emitting element 3B are arrayed. This configuration can be applied to the pixel PixD according to the fifth embodiment. While the fifth embodiment and the modification thereof vary the thickness of the mounting electrodes 24R, 24G, and 24B or the second organic insulating film 97 for each light emitting element 3, the present embodiment and modification are not limited thereto. The thicknesses of both the mounting electrodes 24R, 24G, and 24B and the second organic insulating film 97 may vary, or other layers disposed between the mounting electrodes 24 and the substrate 21 may be used. Alternatively, a layer for adjusting the height may be added between the mounting electrodes 24 and the substrate 21. Instead of the pixel PixD according to the fifth embodiment and the pixel PixE according to the modification, the display device 1E may have the pixel configuration according to the first to the fourth embodiments.

While exemplary embodiments according to the present disclosure have been described, the embodiments are not intended to limit the disclosure. The contents disclosed in the embodiments are given by way of example only, and various changes may be made without departing from the spirit of the present disclosure. Appropriate changes made without departing from the spirit of the present disclosure naturally fall within the scope of the disclosure. At least one of various omissions, substitutions, and changes of the components may be made without departing from the spirit of the embodiments above and the modification thereof.

What is claimed is:
1. A display device comprising:
a substrate;
a plurality of pixels provided to the substrate; and
a plurality of light emitting elements provided to the respective pixels, wherein
the light emitting elements include a plurality of first light emitting elements configured to output red light, a plurality of second light emitting elements configured to output green light, and a plurality of third light emitting elements configured to output blue light,
the first light emitting elements are arrayed on the substrate in a first direction and a second direction intersecting the first direction,
the third light emitting element has a part not overlapping the first light emitting element or the second light emitting element when one of the pixels is viewed in the first direction,
the third light emitting element has a part not overlapping the first light emitting element or the second light emitting element when one of the pixels is viewed in the second direction,
the pixels include a first pixel and a second pixel alternately arrayed in the second direction,
the first pixel includes the second light emitting element, the first light emitting element, the second light emitting element, and the third light emitting element arrayed in order in the first direction, and
the second pixel includes the second light emitting element, the third light emitting element, the second light emitting element, and the first light emitting element arrayed in order in the first direction.

2. The display device according to claim 1, wherein
the second light emitting element has a part not overlapping the first light emitting element or the third light emitting element when one of the pixels is viewed in the first direction, and
the second light emitting element has a part not overlapping the first light emitting element or the third light emitting element when one of the pixels is viewed in the second direction.

3. The display device according to claim 1, wherein
the pixels each have a region provided with the third light emitting element alone between a first end and a second end positioned in the first direction, and
the pixels each have a region provided with the third light emitting element alone between a third end and a fourth end positioned in the second direction.

4. The display device according to claim 1, wherein
the height of the first light emitting element is higher than the height of the second light emitting element, and
the height of the second light emitting element is higher than the height of the third light emitting element.

5. The display device according to claim 1, wherein
the area of the first light emitting element is larger than the area of the second light emitting element, and
the area of the second light emitting element is larger than the area of the third light emitting element.

6. The display device according to claim 1, wherein
at least part of the third light emitting element is positioned, in the first direction, between the first light emitting elements disposed side by side in the first direction and between the second light emitting elements disposed side by side in the first direction, and
at least part of the third light emitting element is positioned, in the second direction, between the first light emitting elements disposed side by side in the second direction and between the second light emitting elements disposed side by side in the second direction.

7. The display device according to claim 1, wherein
at least part of the second light emitting element is positioned, in the first direction, between the first light emitting elements disposed side by side in the first direction and between the third light emitting elements disposed side by side in the first direction, and
at least part of the second light emitting element is positioned, in the second direction, between the first light emitting elements disposed side by side in the second direction and between the third light emitting elements disposed side by side in the second direction.

8. A display device comprising:
a substrate;
a plurality of pixels provided to the substrate; and
a plurality of light emitting elements provided to the respective pixels,
wherein
the light emitting elements include a plurality of first light emitting elements configured to output red light, a plurality of second light emitting elements configured to output green light, and a plurality of third light emitting elements configured to output blue light,
the first light emitting elements are arrayed on the substrate in a first direction and a second direction intersecting the first direction,
the third light emitting element has a part not overlapping the first light emitting element or the second light emitting element when one of the pixels is viewed in the first direction,
the third light emitting element has a part not overlapping the first light emitting element or the second light emitting element when one of the pixels is viewed in the second direction,
the first light emitting element, the second light emitting element, and the third light emitting element are arrayed in the first direction,
the length of the first light emitting element in the second direction is shorter than the length of the second light emitting element in the second direction, and
the length of the second light emitting element in the second direction is shorter than the length of the third light emitting element in the second direction.

9. The display device according to claim 8, wherein
the second light emitting element has a part not overlapping the first light emitting element or the third light emitting element when one of the pixels is viewed in the first direction, and
the second light emitting element has a part not overlapping the first light emitting element or the third light emitting element when one of the pixels is viewed in the second direction.

10. The display device according to claim 8, wherein
the pixels each have a region provided with the third light emitting element alone between a first end and a second end positioned in the first direction, and
the pixels each have a region provided with the third light emitting element alone between a third end and a fourth end positioned in the second direction.

11. The display device according to claim 8, wherein
the height of the first light emitting element is higher than the height of the second light emitting element, and
the height of the second light emitting element is higher than the height of the third light emitting element.

12. The display device according to claim 8, wherein
at least part of the third light emitting element is positioned, in the first direction, between the first light emitting elements disposed side by side in the first direction and between the second light emitting elements disposed side by side in the first direction, and
at least part of the third light emitting element is positioned, in the second direction, between the first light emitting elements disposed side by side in the second direction and between the second light emitting elements disposed side by side in the second direction.

13. The display device according to claim 8, wherein
at least part of the second light emitting element is positioned, in the first direction, between the first light emitting elements disposed side by side in the first direction and between the third light emitting elements disposed side by side in the first direction, and
at least part of the second light emitting element is positioned, in the second direction, between the first light emitting elements disposed side by side in the second direction and between the third light emitting elements disposed side by side in the second direction.

* * * * *